(12) United States Patent
Shizuno (10) Patent No.: US 6,914,327 B2
(45) Date of Patent: Jul. 5, 2005

(54) SEMICONDUCTOR DEVICE AND MANUFACTURING METHOD THEREOF

(75) Inventor: Yoshinori Shizuno, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/849,385

(22) Filed: May 20, 2004

(65) Prior Publication Data

US 2005/0121781 A1 Jun. 9, 2005

(30) Foreign Application Priority Data

Dec. 3, 2003 (JP) .......................................... 2003/404989

(51) Int. Cl.[7] .............................................. H01L 23/04
(52) U.S. Cl. ........................ 257/698; 257/690; 257/678
(58) Field of Search ................................ 257/698, 690, 257/678, 680, 691, 693, 702

(56) References Cited

U.S. PATENT DOCUMENTS 6,391,685 B1    5/2002   Hikita et al.

FOREIGN PATENT DOCUMENTS

JP    2002-243900    9/2000
JP    2002-110951    4/2002

Primary Examiner—Eddie Lee
Assistant Examiner—Douglas W. Owens
(74) Attorney, Agent, or Firm—Rabin & Berdo, P.C.

(57) ABSTRACT

A semiconductor device includes a substrate which has a main surface, a back surface, and a through hole. The semiconductor device also includes an insulating film formed on an inner wall of the through hole, a conductive member provided on the insulating film within the through hole, an external terminal provided above the main surface, and a wiring portion connected to the external terminal. The semiconductor device also includes an encapsulating layer which covers the main surface and the wiring portion except for a portion to which the external terminal is connected. A side surface of the encapsulating layer is formed inside a side surface of the substrate.

9 Claims, 7 Drawing Sheets

SEMICONDUCTOR DEVICE AND MANUFACTURING METHOD THEREOF

BACKGROUND OF THE INVENTION

1. Field of the Invention

The present invention relates to a semiconductor device having a package structure and a method of manufacturing the same.

This application is counterpart of Japanese patent applications, Serial Number 404987/2003, filed Dec. 3, 2003, the subject matter of which is incorporated herein by reference.

2. Description of the Related Art

There has recently been an increasingly demand for a reduction and thinning of an outer size (package size) of a semiconductor device mounted to electronic equipment such as a portable device. With its demand, there has been proposed a CSP (Chip Size Package) corresponding to a semiconductor device packaged to an outer size substantially identical to an outer size of a semiconductor chip.

In terms of a reduction in the manufacturing cost, attention is now given, as one form of CSP, to a WCSP (WaferLevel Chip Size Package or WaferLevel Chip Scale Package) obtained by fractionalization through the use of dicing or the like after processes up to an external terminal forming process have been completed in a wafer state (see, for example, a patent document 1).

There is also known a bear chip having a configuration equipped with through portions in which conductors are formed on inner wall surfaces of through holes that pass between the obverse and reverse sides of a substrate (see, for example, a patent document 2). Since the transmission of a signal between the front and back surfaces of the bear chip is enabled by virtue of the through portion, laminated packages laminated in plural form in the direction of thickness of the bear chip can be configured.

Such through portions are normally formed in peripheral edge portions, i.e., dicing areas of chips cut out by dicing using a blade. This is because since there is a need to lay out circuit elements in the high density in a circuit element forming area (also called "active area") surrounded by the dicing areas, there is no space for each through portion, and the through portions are formed in the active area, thereby causing the fear of the scale-up of a chip size and an increase in manufacturing cost. Incidentally, the dicing areas used herein means surfaces to be cut off by dicing and areas located in the neighborhood thereof.

Patent Document 1
Japanese Laid Open Patent Application No. 2002-110951
Patent Document 2
Japanese Laid Open Patent Application No. 2000-243900

However, cracks and chipping-off are easy to take place in each dicing area due to the shock of the blade at the dicing. Therefore; there was a fear that the through portions formed in the dicing area were damaged due to the occurrence of such cracks and chipping-off or the like, thereby causing degradation of reliability. Particularly when micro cracks has occurred in each dicing area, it was difficult to discriminate the through portions subjected to the damage from outward appearance. Thus, it was very difficult to manage the quality of each chip.

In the wafer's dicing used up to now, the back surface of a wafer was fixed onto a dicing sheet and thereafter the wafer was cut off from the exposed surface of the wafer by use of a blade. Therefore, the occurrence of cracks and chipping-off greatly take place on the back side of the wafer in particular due to wafer's vibrations developed by the blade, thereby causing the damage of the through portions.

Therefore, three has been proposed a method of expanding the spacing or interval of a through portion between adjacent chips and ensuring it sufficiently in order to avoid the damage of the through portions due to the cracks and chipping-off. Since, however, the number of chips cuttable per wafer is reduced due to the expansion of the width of each dicing area, the manufacturing cost will increase.

Although there has heretofore been proposed a method utilizing heat fusion using laser light as the dicing method using the laser light, there are a lot of problems to be solved such as thermal distortion, contamination, etc.

SUMMARY OF THE INVENTION

Thus, the present invention has been made to solve the foregoing problems. It is a principal object of the present invention to provide a semiconductor device having high reliability and high productivity without expanding a package size than ever, and a manufacturing method thereof.

According to one aspect of the present invention, there is provided a semiconductor device, comprising:

a substrate which has a main surface including a central area formed with a circuit element and an electrode pad connected to the circuit element and a peripheral area surrounding the central area, which has a back surface opposite to the main surface, and which has a through hole defined in the peripheral area and extending from the main surface to the back surface;

an insulating film formed on an inner wall of the through hole;

a conductive member provided on the insulating film within the through hole and electrically connected to the circuit element;

an external terminal provided above the main surface;

a wiring portion which connects the external terminal and the electrode pad; and an encapsulating layer which covers the main surface and the wiring portion except for a portion to which the external terminal is connected, wherein a side surface of the encapsulating layer is formed inside a side surface of the substrate.

According to another aspect of the present invention, there is provided a method of manufacturing a semiconductor device, comprising the following steps of, upon cutting a plate-shaped object to be processed to fractionalize the same into a plurality of packages, thereby fabricating each individual semiconductor device:

preparing the object comprising:
 a substrate including a main surface having a central area formed with circuit elements and electrode pads connected to the circuit elements, and a peripheral area that surrounds the central area; a back surface opposite to the main surface; and through holes which are defined in the peripheral area and extend therethrough from the main surface to the back surface;

an insulating film formed on inner walls of the through holes;

conductive members provided on the insulating film lying within the through holes and respectively electrically connected to the circuit elements;

external terminals provided above the main surface;

wiring portions that electrically connect the external terminals and the electrode pads respectively; and an encapsulating layer that covers the wiring portions and the main surface from thereabove with surfaces being in touch between the external terminals and the wiring portions being left behind, performing the cutting of the substrate by an unheated system using laser light; and carrying out the cutting of the encapsulating layer by a blade.

According to such a configuration, the side faces of the encapsulating layer are respectively formed inside the side faces of the substrate.

According to yet another aspect of the present invention, there is provided a method of manufacturing a semiconductor device, comprising the following steps of, upon cutting a plate-shaped object to be processed to fractionalize the same into a plurality of packages, thereby fabricating each individual semiconductor device:

preparing the object comprising:

a substrate, said substrate including a semiconductor support substrate, an insulating film formed on the semiconductor support substrate, and a semiconductor layer formed on the insulating film, said semiconductor layer having a main surface including a central area formed with circuit elements and electrode pads connected to the circuit elements and a peripheral area that surrounds the central area;

trench portions defined in the peripheral area, which extend from the main surface of the substrate to the support substrate;

conductive members provided within the trench portions and electrically insulated from the semiconductor layer, said conductive members being electrically connected to the circuit elements and the semiconductor layer respectively;

external terminals provided above the main surface;

wiring portions that electrically connect between the external terminals and the electrode pads; and an encapsulating layer that covers the wiring portions and the main surface from thereabove with surfaces being in touch between the external terminals and the wiring portions being left behind, performing the cutting of the substrate by an unheated system using laser light; and carrying out the cutting of the encapsulating layer by using a blade.

The side faces on the substrate side can be formed by cutting the substrate using laser dicing of an unheated system (or also called "non-melting system") using laser light. In the laser dicing of the unheated system, a member to be cut can be cut off without almost producing cracks and chipping-off therein. High-speed dicing is enabled as compared with the conventional dicing method using the blade.

As a result, it is possible to suppress suffering of damage of through portions provided in a substrate in a dicing area and degradation of reliability of each cut-out semiconductor device, both of which have been produced as before.

In addition, there is no need to expand the spacing or interval of a through portion provided between adjacent semiconductor devices in order to avoid the damage of each through portion by such dicing. It is therefore unnecessary to expand the width of the dicing area than ever.

Thus, a semiconductor device excellent in reliability and productivity can be obtained without the number of semiconductor devices cuttable per wafer.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. Incidentally, the drawings merely schematically show the sizes, shapes and positional relationships of respective components to such a degree that the present invention can be understood. Thus, the present invention is by no means limited to the illustrated examples. In order to make it easy to understand the drawings, hatchings indicative of cross-sections are omitted except for parts. Incidentally, embodiments to be described below are simply preferred examples and illustrated numerical conditions are by no means limited to them. Similar components illustrated in the respective drawings are respectively identified by the same reference numerals, and the description of certain common components might be omitted.

<First Embodiment>

Figure 1A:
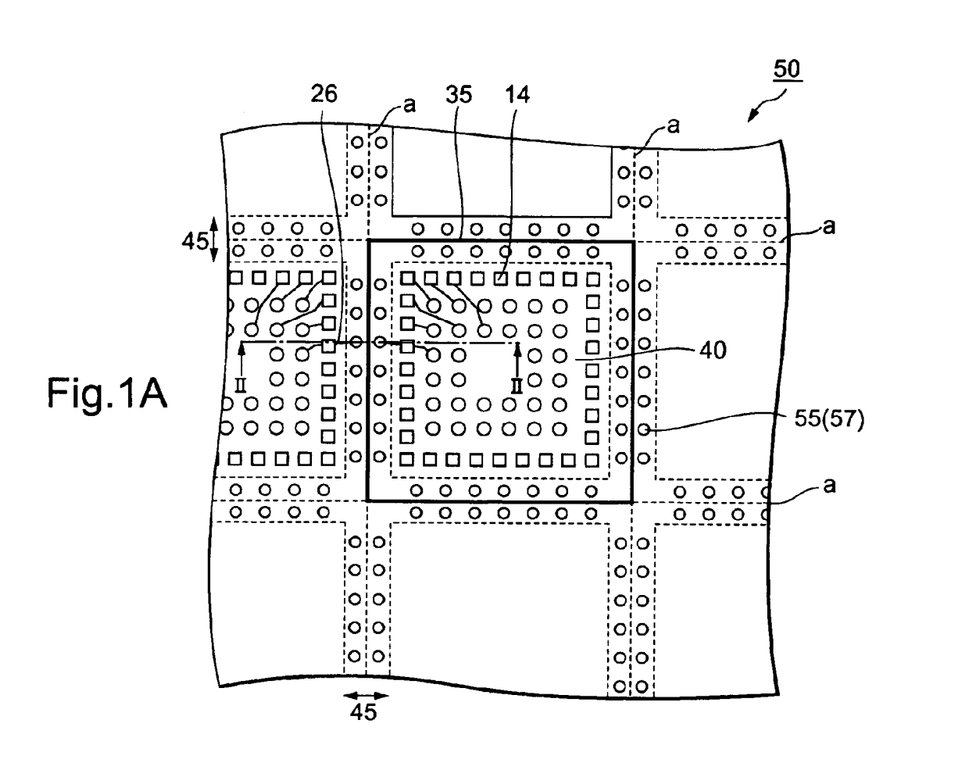
FIG. 1 is a schematic plan view showing part of a wafer prior to being diced into semiconductor devices each according to a first embodiment of the present invention.
Figure 2A:
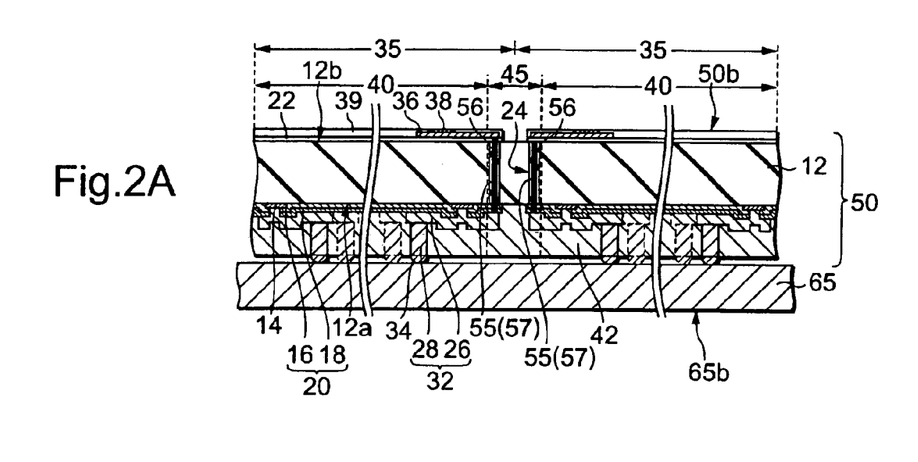
FIGS. 2(A) and 2(B) are respectively process views (part 1) for describing a process for manufacturing the semiconductor device according to the first embodiment of the present invention.
Figure 2B:
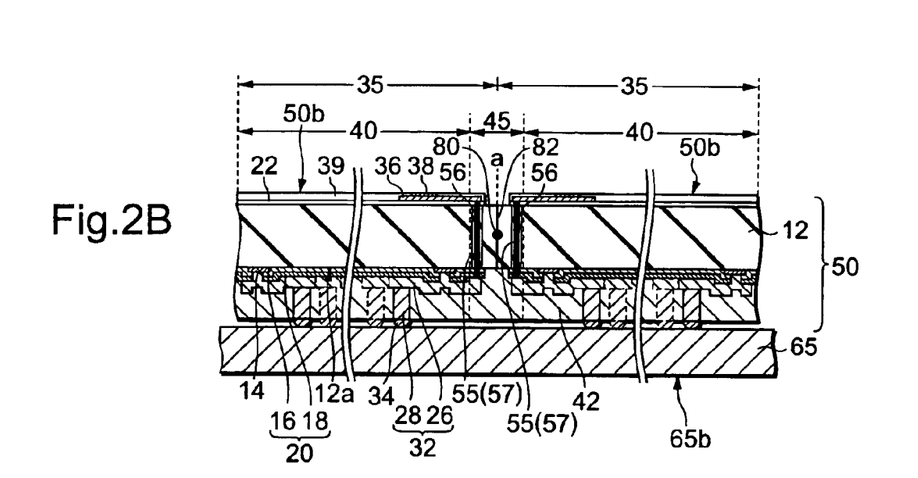
Figure 3A:
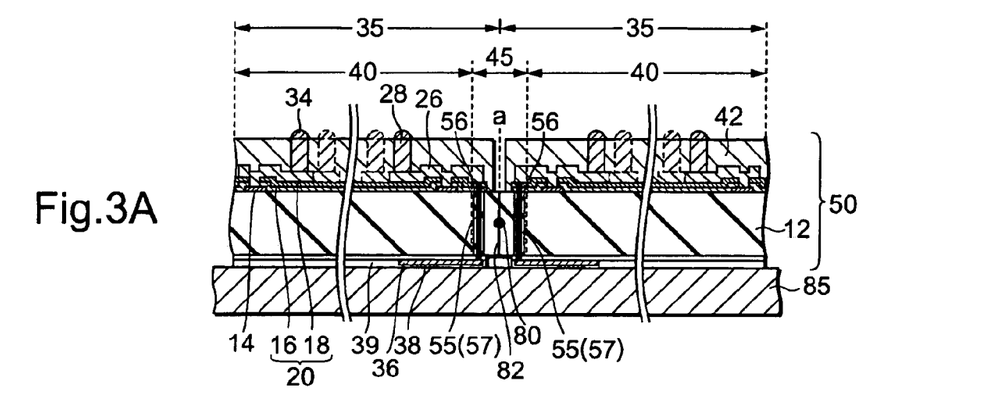
FIGS. 3(A) and 3(B) are respectively process views (part 2) for describing a process for manufacturing the semiconductor device according to the first embodiment of the present invention.
Figure 3B:
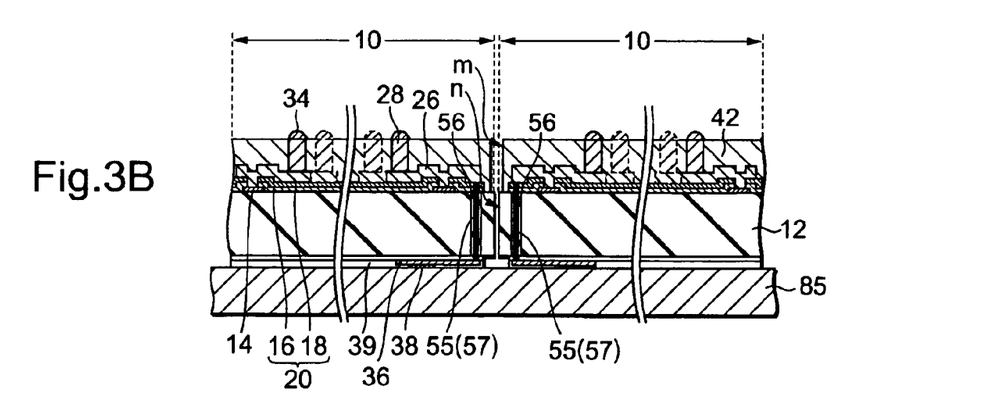

A first embodiment of the present invention will be explained with reference to FIGS. 1 through 3. FIG. 1(A) is a plan view schematically showing part of a wafer prior to be diced into semiconductor devices each according to the present embodiment. FIG. 2(A) is a cross-sectional view as seen in the direction indicated by arrows in the figure, of a cut-away portion (i.e., a cross-section) obtained by cutting FIG. 1(A) along the dashed line II—II. FIGS. 2(B) through 3(B) are respectively cross-sectional views following FIG. 2(A), for describing the semiconductor device according to the present embodiment and a method of manufacturing the same. Incidentally, the illustrations of a second wiring layer 36, lands 38 and a surface protective film 39 all formed on the back surface of a substrate, are omitted in FIG. 1(A).

The present embodiment will explain, by way of example, a package structural body 50 in which WCSPs 10 each having a package structure capable of constituting a laminated package are cut out, as an object or target to be processed which needs a dicing process.

First of all, as shown in FIG. 1(A), a wafer-shaped package structural body 50 (to be described later) in which process steps up to the formation of external terminals and lands (not shown) on the obverse and reverse sides of an object to be processed have been completed, is prepared as the object. Sub areas 35 cut out as WCSPs 10 (hereinafter simply might be called "WCSPs" and see FIG. 3(B)) each having a package structure via an individualizing process to be described later are arranged in the package structural body 50 in matrix form.

Described specifically, peripheral edge portions of a surface area of each sub area 35 are peripheral areas (or also called dicing areas) 45 having predetermined widths including cut surfaces a fractionalized every WCSPs 10. An area surrounded by the dicing areas 45 of each sub area 35 is a central area (or also called "circuit element forming area") 40 having circuit elements. Electrode pads 14 are disposed along the outer periphery of the circuit element forming area 40 every predetermined intervals. Also the electrode pads 14 are. electrically connected to their corresponding solder balls 34 via a dedicated first redistribution wiring layer 26 that extends toward the inside of the circuit element forming area 40. Through portions (or also called "contact portions") 55 (to be described later) included in the adjacent sub areas 35 are respectively placed in opposing relationship at positions which interpose plane or surfaces a (or also called "cut surfaces") to be cut at the dicing areas 45.

Subsequently, the package structural body 50 will be explained with reference to FIG. 2(A).

Electrode pads 14 made of aluminum, which are electrically connected to their corresponding circuit elements, are formed in their corresponding circuit element forming area 40 of a main surface 12a of a substrate 12 that constitutes the package structural body 50. In the present embodiment, the substrate 12 is configured as a silicon substrate. A first insulating layer 20 in which a passivation film 16 made up of a silicon nitride film and a protective film 18 made up of a polyimide film are sequentially laminated, is formed on the main surface 12a of the silicon substrate 12 so as to expose parts of top faces of the electrode pads 14. A second insulating layer 22 made up of a silicon oxide film is formed on a back surface 12b opposite to the main surface 12a of the silicon substrate 12.

Further, the above-described through portions 55 are conductive columnar portions that penetrate between the main surface and back surface (12a and 12b) of the silicon substrate 12 in the dicing area 45. The through portions 55 make it possible to make conductive between the obverse and reverse sides of the silicon substrate 12. As a result, the transfer of input/output signals between the obverse and reverse sides of the WCSP 10 of each laminated package is enabled, and the WCSPs are laminated in the thickness direction so that the laminated package can be configured. The through portions 55 are formed by, for example, forming the first and second insulating layers (20, 22) in the main surface and back surface (12a and 12b) of the silicon substrate and thereafter defining through holes (i.e., holes extending through the first and second insulating layers) 24 extending therethrough by a drill or the like. Thereafter, an insulating film 56 is coated on an inner wall (or also called "on an internal surface") of each through hole 24 by using an insulating material (not shown), and a conductive member 57 such as copper or the like is formed on the insulating film 56 by plating, whereby the corresponding through portion 55 is obtained.

The respective electrode pads 24 are electrically connected to both or either one of one ends of the through portions 55 and one ends of post portions 28 constituting a wiring portion 32 via the first wiring layer 26 used as a wring pattern constituting the wiring portion 32 formed on the first insulating layer 20. That is, the wiring portion 32 in the present configurational example includes the first wiring layer 26 extending in the direction parallel to the main surface 12a of the silicon substrate 12, and the post portion 28 that protrudes toward above the first wiring layer 26 in the direction normal to the main surface 12a. The wiring portion 32 constitutes a convex portion that protrudes in the direction normal to the main surface 12a as a whole. One end of the wiring portion 32 is connected to the electrode pads 14, and the top face of the other end thereof is exposed without being covered with an encapsulating layer 42 to be described later. The other end of the through portion 55 is electrically connected to lands 38 via a second wiring layer 36 formed on the second insulating layer 22. Each land 38 is provided on the second wiring layer 36 exposed from an opening defined in a surface protective film (or also called "solder resist film") 39 that covers the entirety of the back surface 12b of the silicon substrate 12. Incidentally, the first and second wiring layers (26, 36) are formed of copper (Cu) and function as redistribution wiring layers capable of redistributing the post portions 28 and the lands 38 at desired positions respectively. Thus, the first and second wiring layers (26 and 36) are also called "first and second redistribution wiring layers" respectively. The encapsulating layer 42 that covers the abovedescribed components (14, 20 and 32) is formed over the whole main surface 12a of the silicon substrate 12 with such a thickness that the top faces of the post portions 28 are exposed. Solder balls 34 corresponding to external terminals are formed on their corresponding top faces of the post portions 28 exposed from the encapsulating layer 42.

Owing to the above-described configuration, the transfer of input/output signals between the obverse and reverse sides is enabled and WCSPs each capable of constituting the laminated package is obtained by their lamination in the thickness direction.

Described specifically, a signal outputted from a circuit element is transmitted to a path extending from the electrode pad 14 to the solder ball 34 via the wiring portion 32 and a path extending from the electrode pad 14 to the land 38 via the first wiring layer 26, through portion 55 and second wiring layer 36. A signal inputted from each of the solder ball 34 and the land 38 is transmitted via paths opposite to the above. Incidentally, the transmission paths are not limited to the above-described paths and can be formed as various wiring paths according to purposes and design.

Subsequently, the solder balls 34 included in the wafer-shaped package structural body 50 are fixed onto a dicing sheet 65. As the dicing sheet 65, may be used, for example, one in which an ultraviolet cured acrylic resin used as an adhesive material is applied onto the surface of a base material made of polyolefin.

Subsequently, the wafer-shaped package structural body 50 is cut among the through portions 55 of the adjacent sub areas 35 in the following procedure so as to be brought into fractionization every package WCSPs 10.

First of all, the silicon substrate 12 between the through portions 55 of the adjacent sub areas 35 is cut along the surfaces a to be cut off.

Since the silicon substrate 12 has permeability relative to laser light in the present embodiment, the cutting of the silicon substrate 12 is done using a non-melting system (or also called "unheated processing system") using laser light.

In the present configurational example, laser dicing of the nonmelting system is carried out assuming that irradiation conditions for the laser light, e.g., a light source is set as a YAG laser, the wavelength of the laser light is set as 1064 nm and a spot sectional area of the laser light is set as $3.14 \times 10^{-8} cm^2$. Since infrared radiation is transmitted through the silicon substrate 12, the alignment at the irradiation of the laser light can be done by observing it with an infrared camera. Incidentally, the irradiation conditions for the laser light are not limited to only the above but can be set arbitrarily and suitably according to purposes and design.

Described specifically, laser light is applied along each surface a to be cut off while a light convergence point of the laser light is being focused on a predetermined position lying inside the silicon substrate 12.

Figure 1B:
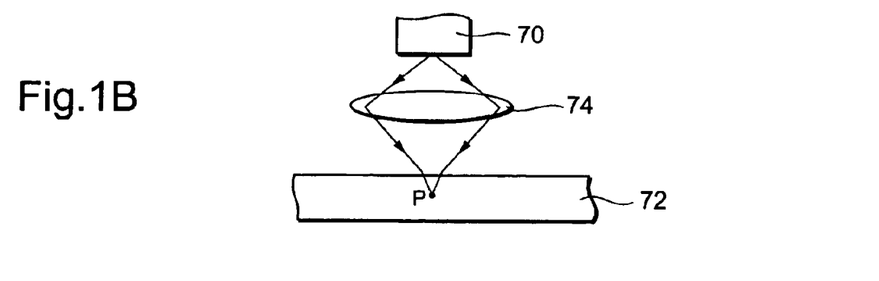

On example of an apparatus for irradiating the laser light at this time takes a configuration in which a condenser lens 74 is provided at a predetermined position between a laser light source 70 and an object or target 72 as shown in FIG. 1(B). According to such a configuration, the laser light can be selectively concentrated on an arbitrary portion as viewed in the direction of depth of the object 72 by the condenser lens 74 (light convergence point is expressed in P in the figure).

A modified portion 80 caused by multiple photon absorption is formed by laser light gathered inside the silicon substrate 12 with high accuracy. At this time, a crack 82 with the modified portion 80 as its starting point occurs due to internal stress and distortion with the formation of the modified portion 80. That is, since the crack 82 occurs due to their occurrence occurs, the modified portion 80 is also referred to as a crack generation source.

Thus, the silicon substrate 12 can be cut using the crack 82 generated along the surface a. to be cut off in the dicing area 45 (see FIG. 2(B)). Incidentally, although the crack 82 used here is used as a through cut that extends from the back surface 12b of the silicon substrate 12 to its main surface 12a, it may be a half cut that does not reach the main surface 12a of the silicon substrate 12. In such a case, predetermined dicing is thereafter additionally done to thereby cut the silicon substrate 12. Incidentally, after the cutting of part of the silicon substrate 12, the encapsulating layer 42 having non-permeability hard to make the laser light transmissive remains in the dicing area 45 without being cut.

Thereafter, a back surface 50b opposite to the surface brought into contact with the dicing sheet 65, of the package structural body 50 is absorbed or sucked by a vacuum suction apparatus or a back surface 65b of the dicing sheet 65 is sucked by the vacuum suction apparatus to peel the dicing sheet 65 from the package structural body 50. Then the back surface 50b on the silicon substrate side, of the package structural body 50 is fixed onto a new dicing sheet 85 in which a bonding material is applied onto the surface of a base material.

Next, the encapsulating layer 42 lying among the through portions 55 of the adjacent respective sub areas 35 is cut along the surfaces a to be cut off.

Since the encapsulating layer 42 has non-permeability hard to make the laser light transmissive in the present embodiment, it is cut using a blade rotated at high speed.

As the blade used herein, is used, for example, a blade to which diamond fine grains whose diameters lying within a range of from 20 µm to 30 µm are taken up in large numbers at outer peripheral portions of a metal-made disc, are fixedly secured. In the present configurational example, the cutting of the passivation film 16 and the protective film 18 provided on the silicon substrate 12 is done in conjunction with the cutting of the encapsulating layer 42. Incidentally, since various films can be formed over the silicon substrate 12 in each dicing area 45, either the dicing using the laser light or the dicing using the blade can be done selectively in consideration of the permeability or the like of the films with respect to the laser light.

Consequently, the blade (not shown) rotated about its axis at high speed is pressed against the surface of the encapsulating layer 42 of the dicing area 45 and moved in the direction of the silicon substrate 12 while predetermined pressure is being applied along the surface a to be cut off. At this time, the cut-in depth of the blade is gradually made deep so as to reach the depth at which the main surface 12a of the silicon substrate 12 is exposed (see FIG. 3(A)). Incidentally, as blade's alignment, for example, a mark (not shown) can be formed at each edge of the wafer formed with no encapsulating layer 42.

Thereafter, the ultraviolet cured acrylic resin of the dicing sheet 85 is irradiated with ultraviolet radiation or light and thereby cured. Afterwards, the base material portion is extended in a predetermined direction, and gaps or clearances are defined between the cut respective WCSPs 10 (see FIG. 3(B)). While such a state is being maintained, a force is applied from the back surface of the dicing sheet 85 to individually raise up the WCSPs 10 under pressure, followed by peeling of the individual WCSPs 10 from the dicing sheet.

Each of the peeled-off WCSPs 10 has a structure in which a side face (or also called "side end face") m of the encapsulating layer 42 is formed inside a side face n of the silicon substrate 12. This results from the fact that the side face m of the encapsulating layer 42 is a cut surface formed by the blade, whereas the side face n of the silicon substrate 12 is a cut surface formed by the crack formed based on the modified portion formed by irradiation of the laser light. Let's assume that in the present configurational example, e.g., blade dicing in which the interval or spacing of a cut surface formed by cutting ranges from 50 µm to 200 µm, and laser dicing in which the interval or spacing of a cut surface formed by cutting ranges from 0.2 µm to 4.0 µm are used. In such a case, the side face m is formed inside the side face n within a range of 5 µm to 100 µm.

As is apparent from the above description, the cutting of the silicon substrate in each dicing area is performed using the laser dicing of the unheated system (or also called "non-melting system") in the present embodiment. In the laser dicing of the unheated system, the cut member can be cut without almost producing cracks and chipping-off therein, and high-speed dicing is enabled as compared with the conventional dicing method using the blade.

It is, therefore, possible to suppress the occurrence of cracks and chipping-off in the silicon substrate in each dicing area due to the shock of the blade at dicing as in the prior art.

Thus, since damage of each through portion provided in the silicon substrate in each dicing area can be relaxed, an improvement in the reliability of each cut-out WCSP can be expected.

Further, since the distance between the surface a to be cut off and its corresponding through portion can be shortened, there is no need to expand the interval or spacing of each through portion between the adjacent packages in the wafer, i.e., the width of the dicing area as compared with the conventional one in order to avoid the damage of each through portion due to the dicing.

Therefore, the WCSPs each having high reliability and productivity can be fabricated without reducing the number of the WCSPs cuttable per wafer.

Further, the WCSPs according to the present embodiment are capable of configuring a laminated package by laminating the same in their thickness directions.

<Second Embodiment>

A second embodiment of the present invention will be explained with reference to FIG. 4. FIGS. 4(A) and 4(B) are respectively cross-sectional views for describing a semiconductor device according to the present embodiment and its manufacturing method. Incidentally, components identical to those already described in the first embodiment are respectively identified by the same reference numerals, and their specific description will be omitted (respective embodiments to be described below are also similar to above).

The present embodiment is principally different from the first embodiment in that an encapsulating layer 42 is cut to a depth midway through the encapsulating layer 42 as viewed from the surface 42a side of the exposed encapsulating layer 42, followed by being cleaved for its cutting.

Described specifically, process steps up to the cutting of the silicon substrate 12 are carried out by a method similar to the first embodiment (see FIG. 2(B)).

Figure 4A:
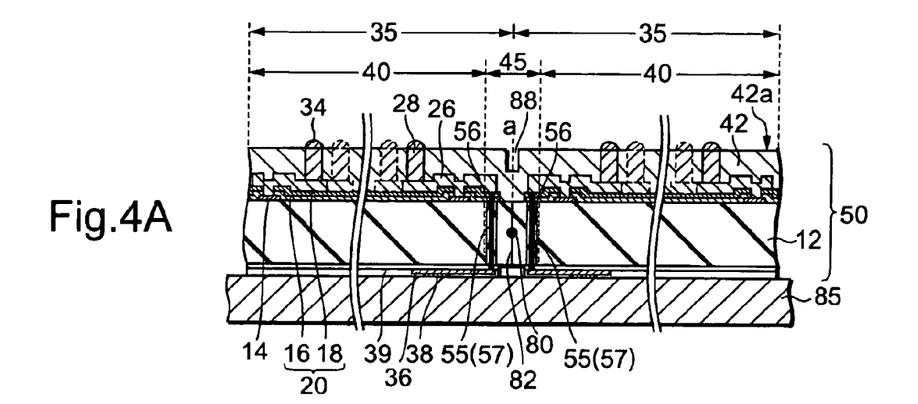
FIGS. 4(A) and 4(B) are respectively process views for describing a process for manufacturing a semiconductor device according to a second embodiment of the present invention.
Figure 4B:
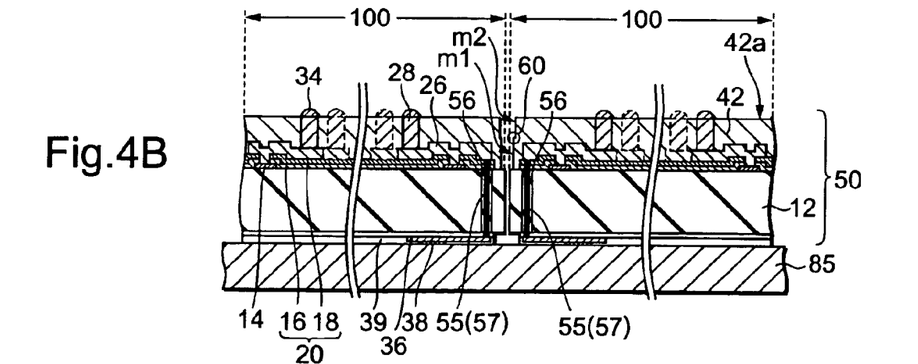

Thereafter, in the present embodiment, a cut-in depth made by a blade is set to a depth midway through the encapsulating layer 42 as viewed from the surface 42a of the encapsulating layer 42 upon cutting the encapsulating layer 42, and trenches 88 are cut into the encapsulating layer 42 (see FIG. 4(A)). Incidentally, the cut-in depth made by the blade at this time may be set to a depth at which the encapsulating layer 42 portion is cuttable by cleavage in a post-process. However, the blade's cut-in depth may more preferably be set so as to be positioned above a first wiring layer 26. By shallowly setting, in this way, the cut-in depth within a range in which the encapsulating layer can be cut off by cleavage, the occurrence of cracks caused by vibrations of a wafer at its dicing in the components such as the first wiring layer, etc. as well as in through portions can be effectively suppressed.

An ultraviolet cured acrylic resin of a dicing sheet 85 is thereafter irradiated with ultraviolet radiation or light and thereby cured. Afterwards, a base material portion is extended in a predetermined direction to thereby cleave the encapsulating layer 42 portion left behind without being cut. Each WCSP 100 is peeled from the dicing sheet 85 by a method similar to the first embodiment (see FIG. 4(B)).

At this time, a side face (or also called "side end face") $m_1$ formed by cleavage, of a side face m on the encapsulating layer 42 side in each peeled WCSP 100 extends out outside a side face $m_2$ formed by the blade. A step portion 60 is formed at the boundary between the side face $m_1$ and the side face $m_2$. Preferably, the step portion 60 is set such that the cut-in depth made by the blade is located above the first wiring layer 26 as described above, and the step portion 60 may preferably be formed above the first wiring layer 26.

As is apparent from the above description, the present embodiment is capable of obtaining an effect similar to the first embodiment.

Further, according to the present embodiment, the cutting of the encapsulating layer in the neighborhood of the silicon substrate is performed by cleavage without being performed by dicing using the blade.

Thus, it is possible to further relax shock of the blade against the silicon substrate in each dicing area and much further suppress the damage of each through portion.

As a result, the width of the dicing area can further be narrowed as compared with the first embodiment, and the fabrication of each higher reliable WCSP can be expected.

<Third Embodiment>

Figure 5:
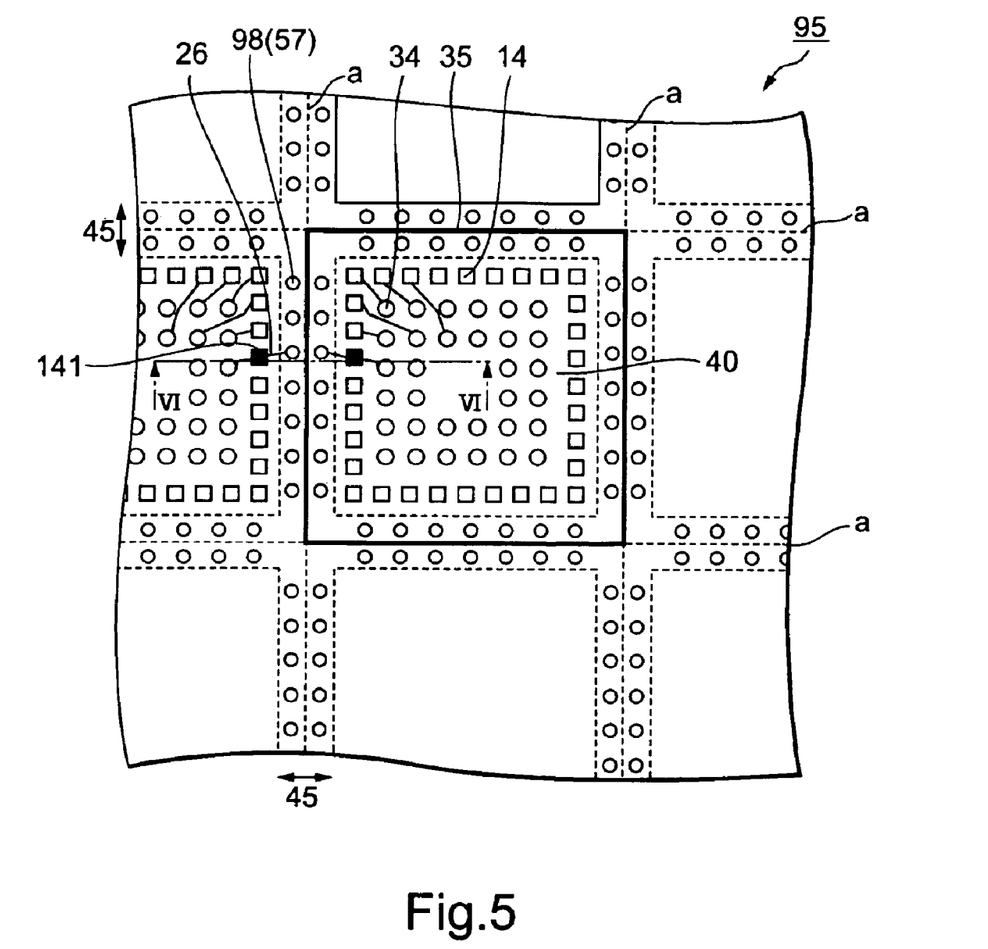
FIG. 5 is a schematic bottom view showing part of a wafer prior to being diced into semiconductor devices each according to a third embodiment of the present invention.
Figure 6A:
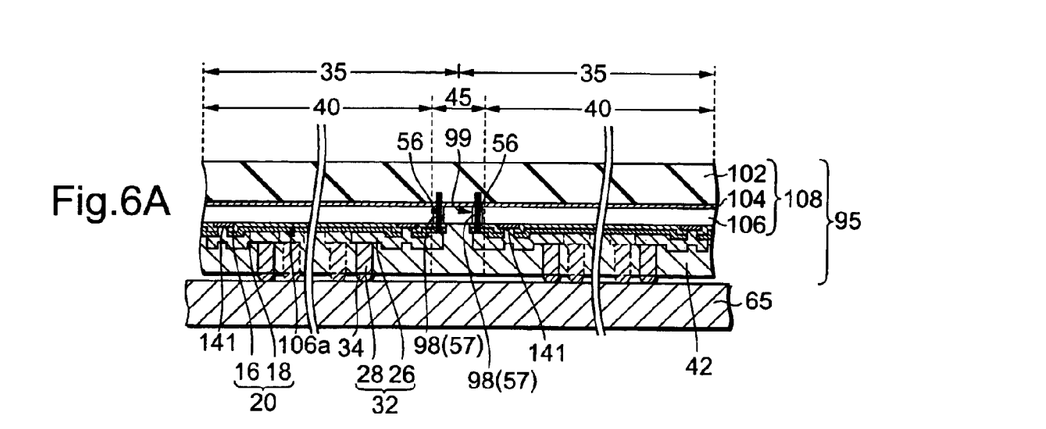
FIGS. 6(A) and 6(B) are respectively process views (part 1) for describing a process for manufacturing the semiconductor device according to the third embodiment of the present invention.
Figure 6B:
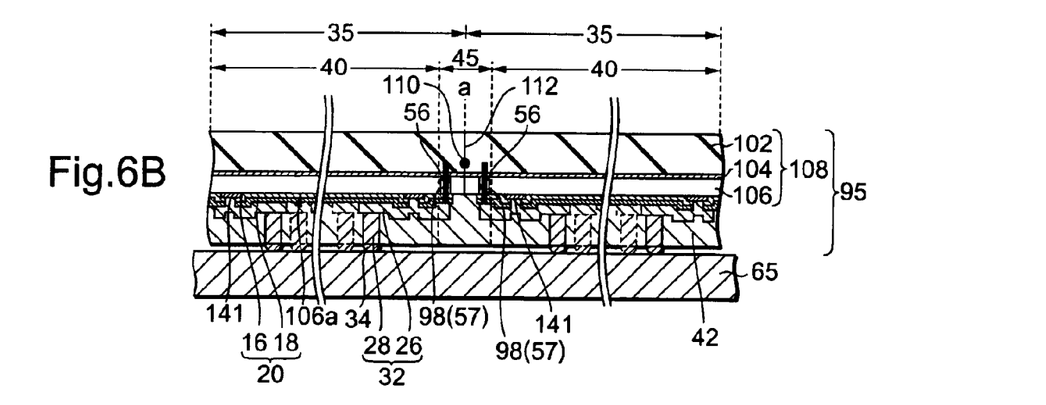
Figure 7A:
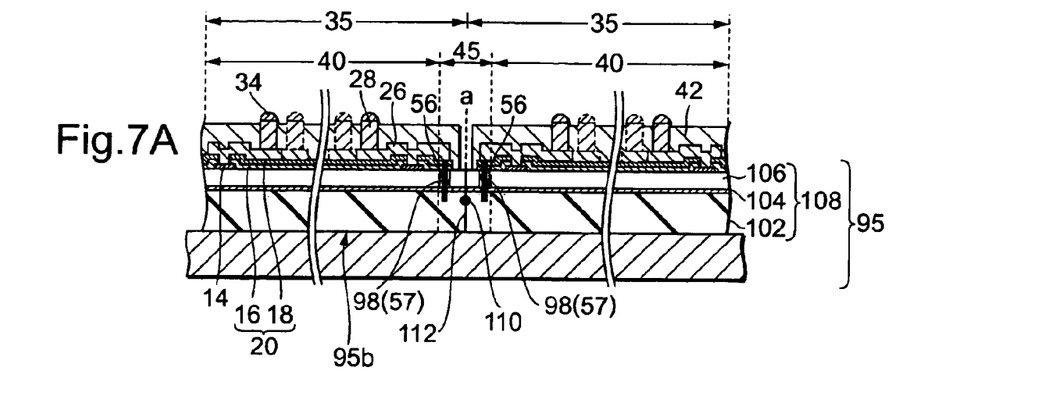
FIGS. 7(A) and 7(B) are respectively process views (part 2) for describing a process for manufacturing the semiconductor device according to the third embodiment of the present invention.
Figure 7B:
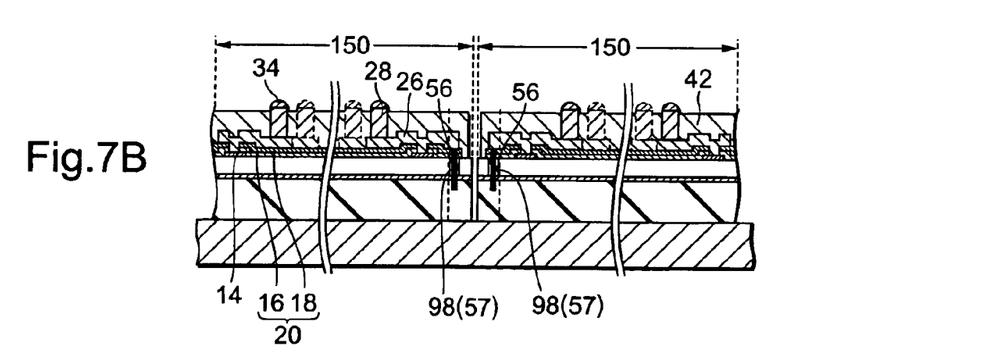

A third embodiment of the present invention will be explained with reference to FIGS. 5 through 7. FIG. 5 is a bottom view schematically showing part of a wafer prior to being diced into semiconductor devices each according to the present embodiment. FIG. 6(A) is a cross-sectional view as seen in the direction indicated by arrows in the figure, of a cut-away portion obtained by cutting FIG. 5 along the dashed line VI—VI. FIGS. 6(B) to 7(B) are respectively cross-sectional views following FIG. 6(A), for describing the semiconductor device according to the present embodiment and a method of manufacturing the same.

The present embodiment is principally different from the first embodiment in that the present invention is applied to a semiconductor device of an SOI structure having an SOI (Silicon On Insulator) substrate as a substrate.

The semiconductor device having the SOI structure includes an SOI substrate of a three-layer structure in which each semiconductor layer (e.g., silicon single crystal layer) formed with circuit elements via an insulating film interposed therebetween is provided on a semiconductor support substrate, and is excellent in high-speed operation and low power consumption. Since the circuit design and mask design of the conventional product can be applied as they are upon fabrication of the semiconductor device having the SOI structure, the semiconductor device is excellent even in cost and reliability. On the other hand, there is a need to fix the potential of the semiconductor support substrate to a ground potential upon adoption of the SOI structure. This is because there is a fear that since the support substrate leads to parasitic capacitance and resistive components although being isolated by an insulating film, they will make unstable the electric characteristics of the semiconductor device. Therefore, when a chip equipped with the SOI substrate is applied to a BGA (Ball Grid Array) structure, for example, the support substrate side of the chip is mounted on and fixed to a predetermined position on a wiring substrate capable of being made conductive to a ground terminal.

On the other hand, although the application of the SOI structure to each WCSP is expected, problems mentioned below arise upon fixing the potential of the support substrate to the ground potential.

Firstly, there is a method of electrically connecting a support substrate of an SOI chip and a mounting board in a configuration in which the semiconductor layer side of the SOI chip is mounted on the mounting board. However, according to the present method, there is a need to ensure a new space for providing an electrical connection to the SOI chip on the mounting board side. Therefore, it is unfit for high-density packaging.

Secondly, there is a method of electrically connecting ground pads provided on a semiconductor layer of an SOI chip and a support substrate by vias defined in a circuit element forming area of the chip. However, according to the present method, there is a need to change circuit design and mask design or the like with the formation of new vias. As a result, there is a possibility that the method will incur an increase in package size as well as a need for a new wafer process. This method is not satisfied in terms of cost and reliability.

The patent document 1 has the fear that since the wafer is fractionalized every packages by dicing using the blade although the configuration in which the SOI structure is applied to each WCSP, is taken, degradation of reliability due to the shock of the blade at the above dicing will take place.

Therefore, the present embodiment will explain below WCSPs each having a high-reliable SOI structure without expanding a package size than ever.

The present embodiment will explain, by way of example, a package structural body 95 from which each WCSP 150 is cut out, as a processed object that needs a dicing process.

Fist of all, as shown in FIG. 5, a wafer-shaped package structural body 95 (to be described later) in which process steps up to the formation of external terminals 34 on the obverse and reverse sides of an object to be processed have been completed, is prepared as the object. Sub areas 35 cut out as WCSPs 150 (see FIG. 6(C)) via an individualizing process to be described later are formed in the package structural body 95 in matrix form.

Described specifically, peripheral edge portions of a surface area of each sub area 35 are peripheral areas (or also called dicing areas) 45 having predetermined widths including cut surfaces a fractionalized every WCSPs 150. An area surrounded by the dicing areas 45 of each sub area 35 is a central area (or also called "circuit element forming area") 40 provided with circuit elements. Electrode pads 14 are disposed along the outer periphery of the circuit element forming area 40 every predetermined intervals. Here, the electrode pads 14 include ones that function as ground pads 141 electrically connected to embedded portions (or also called "vias") 98 (they will be described later). Also the electrode pads 14 are electrically connected to their corresponding solder balls 34 via a dedicated first wiring layer 26 that extends toward the inside of the circuit element forming area 40. The embedded portions (or also called "vias") 98 (to be described later) included in the adjacent sub areas 35 are respectively placed in opposing relationship at positions which interpose plane or surfaces a to be cut off at the dicing areas 45. Subsequently, the package structural body 95 will be explained with reference to FIG. 6(A).

Electrode pads 14 made of aluminum, which are electrically connected to their corresponding circuit elements, are formed on a main surface 106*a* of a semiconductor layer 106 that constitutes an SOI substrate 108 in each circuit element forming area 40. The SOI substrate 108 has a configuration in which the semiconductor layers 106 formed with the circuit elements are sequentially formed on a semiconductor support substrate 102 with an insulating film 104 interposed therebetween. In the present embodiment, the support substrate 102 is configured as a silicon substrate, the insulating film 104 is configured as a silicon oxide film, and the semiconductor layer 106 is configured as a monocrystal silicon layer.

Further, the embedded portions 98 are conductive columnar portions each formed from the main surface 106*a* of the semiconductor layer 106 in each dicing area 45 to a depth (i.e., height) extending to a portion midway through the support substrate 102. The potential of the support substrate 102 can be fixed to a ground potential by the embedded portions 98. As a result, the electric characteristics of each WCSP 150, which is cut out via a subsequent fractionalizing process, can be stabilized. Each of the embedded portions 98 is obtained by, for example, firstly forming; by a drill or the like, a trench portion (or also called "concave portion") 99 so as to reach a depth extending from the surface 106*a* of the semiconductor layer 106 to a portion midway through the support substrate 102 and thereafter coating the boundary of the concave portion 99 and the semiconductor layer 106 with an insulating film 56 by use of an insulating material (not shown), followed by formation of a conductive member 57 such as copper on the corresponding insulating film 56 by plating.

Each of the ground pads 141 used in the present embodiment is electrically connected to one end of the embedded portion 98 and one end of a post portion 28 constituting a wiring portion 32 via a first wiring layer 26 used as a wiring pattern constituting the wiring portion 32 formed on a first insulating layer 20. That is, the wiring portion 32 in the present configurational example comprises the first wiring layer 26 extending in the direction parallel to the main surface 106*a* of each semiconductor layer 106, and the post portion 28 that protrudes in the direction normal to the main surface 106*a* so as to be located on the first wiring layer 26. As a whole, each wiring portion 32 constitutes a convex portion that protrudes in the direction normal to the main surface 106*a*. One end of the wiring portion 32 is connected to its corresponding electrode pad 14 or ground pad 141, and the top face of the other end thereof is exposed without being covered with an encapsulating layer 42 to be described later. Incidentally, the first wiring layer 26 is formed of copper (Cu) and functions even as a redistribution wiring layer capable of redistributing or relocating the corresponding post portion 28 at a desired position as already mentioned. The encapsulating layer 42 is formed over the whole surface 106*a* of the semiconductor layer 106 with such a thickness as to expose the top face of each post portion 28. Each of solder balls 34 is formed on its corresponding top face of the post portion 28, which is exposed from the encapsulating layer 42.

Subsequently, the solder balls 34 included in the wafer-shaped package structural body 95 are fixed onto a dicing sheet 65 in a manner similar to the first embodiment.

Thereafter, since the SOI substrate 108 has permeability with respect to laser light, the cutting of the SOI substrate is performed using a non-melting system (or also called "unheated processing system") using the laser light in a manner similar to the first embodiment (see FIG. 6(B)).

A modified portion 110 caused by multiple photon absorption is formed by laser light gathered inside the SOI substrate 108 with high accuracy in a manner similar to the first embodiment even at this time. At this time, a crack 112 with the modified portion 110 as its starting point occurs due to internal stress and distortion with the formation of the modified portion 110. Thus, the SOI substrate 108 can be cut using the crack 112 generated along the surface a to be cut off in each dicing area 45.

Thereafter, the package structural body 95 is peeled from the dicing sheet 65 in a manner similar to the first embodiment. Afterwards, the back surface 95*b* side on the SOI substrate side, of the package structural body 95 is fixed onto a new dicing sheet 85 in which a bonding material is applied onto a base material surface.

Thereafter, the cutting of the encapsulating layer 42 is performed using a blade rotated at high speed (see FIG. 7(A)). Afterwards, gaps or spacing are defined among the cut respective WCSPs 150 and thereby the individual WCSPs 150 are peeled off (see FIG. 7(B)). Incidentally, the depth at which the encapsulating layer 42 is cut off by the blade, is set to a position placed above the first wiring layer 26 as in the second embodiment even in the case of the present configurational example. Such a configuration that the encapsulating layer 42 is cut off by cleavage, may be adopted.

As is apparent from the above description, the cutting of the SOI substrate in the dicing areas is carried out by the laser dicing of the unheated system in the present embodiment.

It is, therefore, possible to suppress the occurrence of cracks and chipping-off in the SOI substrate in each dicing area due to the shock of the blade at dicing.

Thus, since damage of each embedded portion provided in the SOI substrate in each dicing area can be relaxed, an improvement in the reliability of each cut-out WCSP can be expected.

Further, according to the present embodiment, each cut WCSP is mounted to a mounting board so that a ground potential supplied from terminals formed on the mounting board side to external terminals (solder balls) can be transmitted to the SOI substrate.

Described specifically, a transmission path used to supply a substrate potential from each of solder balls to each of embedded portions via a common electrode pad connected to an electrode pad and a redistribution wiring layer, or a transmission path used to supply a substrate potential from each of solder balls to each of embedded portion via a dedicated post portion and a redistribution wring layer is formed. Thus, this makes it possible to suppress unstability of the electric characteristics of each WCSP, which occurs due to parasitic capacitance and resistive components of a support substrate.

Further, according to the present embodiment, the embedded portions connectable to the ground pads electrically connected to the solder balls 34 each supplied with the ground potential via the redistribution wiring layers used in the WCSP's structure can be formed in each dicing area placed outside the area that functions as each SOI chip in practice. Thus, since there is no need to change circuit design and mask design relative to the SOI chip side, the present embodiment is excellent in cost and reliability.

Owing to the provision of the embedded portions in the dicing area, the WCSPs each having the SOI structure can be realized without expanding a package size than ever.

Therefore, SOI substrate-adaptable WCSPs each having high reliability and productivity can be fabricated without reducing the number of WCSPs cuttable per wafer.

As described above, the present invention is not limited to only the combination of the above-mentioned embodiments. Thus, the present invention can be applied by utilizing suitable conditions in combination at an arbitrary and suitable stage.

For instance, the dicing method of the unheated processing system using the laser light is not limited to only the above-mentioned method. Thus, an unheated processing system (or also called "non-melting system") using various laser lights can be applied according to purposes and design.

Although the above embodiment has explained, by way of example, the wafer-shaped object to be processed prior to being fractionalized into the WCSPs, the present invention is not limited to it. That is, the present invention can be applied to a processed object that needs to make cutting between packages in which through portions are formed in their peripheral edge portions. The shape of the object at this time is not limited to only the round shape but may be set to a rectangular shape, for example.

Although the ultraviolet cured acrylic resins have been used as the adhesive materials for fixing the processed objects in the respective embodiments referred to above, each of the embodiments may take a configuration using wax or the like. No limitation is imposed on the fixing of the object by the dicing sheet. For instance, a fixing jig may be used.

Although the above-described embodiment has explained, as an example, the case in which the silicon substrate is used as the semiconductor substrate, the present invention is not limited to it. For instance, an SOS (Silicon On Sapphire) substrate in which a silicon thin film is formed on a sapphire layer, may be used. In this case, a dicing time interval relative to the sapphire layer corresponding to a hard-to-cut material high in hardness can be greatly shortened as compared with the dicing using the blade.

In the respective embodiments, the dicing using the blade has been carried out after the execution of the laser dicing of the unheated system. However, the order of the individual dicing may be set in reverse according to purposes and conditions or the like.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

what is claimed is:

1. A semiconductor device, comprising:
    a substrate which has a main surface including a central area formed with a circuit element and an electrode pad connected to the circuit element and a peripheral area surrounding the central area, which has a back surface opposite to the main surface, and which has a through hole defined in the peripheral area and extending from the main surface to the back surface;
    an insulating film formed on an inner wall of the through hole;
    a conductive member provided on the insulating film within the through hole and electrically connected to the circuit element;
    an external terminal provided above the main surface;
    a wiring portion which connects the external terminal and the electrode pad; and
    an encapsulating layer which covers the main surface and the wiring portion except for a portion to which the external terminal is connected,
    wherein a side surface of the encapsulating layer is formed inside a side surface of the substrate.

2. A semiconductor device according to claim 1, wherein the wiring portion includes a wiring pattern extending in the direction parallel to the main surface of the substrate and a conductor portion connected to the external terminal, and the conductive member and the circuit element is electrically connected via the wiring pattern.

3. A semiconductor device according to claim 1, wherein the substrate is a silicon substrate or a sapphire substrate whose surface is formed with a silicon thin film.

4. A semiconductor device according to claim 1, wherein the side surface of the encapsulating layer is formed with cut surface cut by a blade, and the side surface of the substrate is formed with a cut surface cut by laser light.

5. A semiconductor device according to claim 4, wherein the side surface of the encapsulating layer is formed with a step portion.

6. A semiconductor device according to claim 5, wherein the step portion is located between the wiring pattern and the surface of the encapsulating layer.

7. A semiconductor device, comprising:
    a substrate which has a semiconductor support substrate, an insulating film formed on the semiconductor support substrate, and a semiconductor layer formed on the insulating film, said semiconductor layer having a main surface including a central area formed with a circuit element and an electrode pad connected to the circuit element and a peripheral area that surrounds the central area;

a trench portion defined in the peripheral area, which extends from the main surface of the substrate to the support substrate;

a conductive member provided within the trench portion and electrically insulated from the semiconductor layer, said conductive member being electrically connected to the circuit element and the semiconductor support substrate;

an external terminal provided above the main surface;

a wiring portion that electrically connects between the external terminal and the electrode pad; and an encapsulating layer that covers the main surface and the wiring portion except for a portion to which the external terminal is connected, wherein a side surface of the encapsulating layer is formed inside a side surface of the substrate.

8. A semiconductor device according to claim 7, wherein the wiring portion includes a wiring pattern extending in the direction parallel to the main surface of the substrate and a conductor portion connected to the external terminal, and the conductive member and the circuit element are electrically connected via the wiring pattern.

9. A semiconductor device according to claim 7, wherein the side surface of the encapsulating layer is formed with a cut surface cut by a blade, and the side surface of the substrate is formed with a cut surface cut off by laser light.

* * * * *

UNITED STATES PATENT AND TRADEMARK OFFICE
CERTIFICATE OF CORRECTION

PATENT NO. : 6,914,327 B2  Page 1 of 1
DATED : July 5, 2005
INVENTOR(S) : Yoshinori Shizuno It is certified that error appears in the above-identified patent and that said Letters Patent is hereby corrected as shown below:

<u>Title page,</u>
Item [30], should read,
-- Foreign Application Priority Data
Dec. 3, 2003 (JP) …………..2003-404987 --.

Signed and Sealed this

Twenty-second Day of November, 2005

JON W. DUDAS
*Director of the United States Patent and Trademark Office*